United States Patent [19]

Ohsawa

[11] 4,160,217
[45] Jul. 3, 1979

[54] PHASE LOCKED LOOP CIRCUIT

[75] Inventor: Mitsuo Ohsawa, Fujisawa, Japan

[73] Assignee: Sony Corporation, Tokyo, Japan

[21] Appl. No.: 931,987

[22] Filed: Aug. 8, 1978

Related U.S. Application Data

[63] Continuation of Ser. No. 780,243, Mar. 22, 1977, abandoned.

[30] Foreign Application Priority Data

Apr. 1, 1976 [JP] Japan .................................. 51-36525

[51] Int. Cl.² ............................................. H03B 3/04
[52] U.S. Cl. .................................. 331/8; 179/15 BT;
307/232; 329/50; 329/103; 329/122; 331/27;
331/64
[58] Field of Search ............ 179/15 BT, 1 G; 329/50,
329/103, 122, 124, 125, 101; 331/8, 16, 25, 27,
44, 64; 325/36, 346, 416–423; 307/232

[56] References Cited

U.S. PATENT DOCUMENTS

| 3,080,533 | 3/1963 | Edwards | 331/27 X |
|---|---|---|---|
| 3,711,652 | 1/1973 | Metro | 179/15 BT |
| 3,801,925 | 4/1974 | Parkyn | 331/1 A |
| 3,962,551 | 6/1976 | Gay | 179/15 BT |

Primary Examiner—Siegfried H. Grimm
Attorney, Agent, or Firm—Lewis H. Eslinger; Alvin Sinderbrand

[57] ABSTRACT

A phase locked loop includes a variable frequency oscillator, a phase comparator for comparing the phase between an output signal derived from the variable frequency oscillator and a reference signal and for generating a control signal in response to the phase difference between the two signals for controlling the variable frequency oscillator, an indicator for indicating the phase difference between the signals, and a control circuit for varying the frequency of the variable frequency oscillator.

1 Claim, 8 Drawing Figures

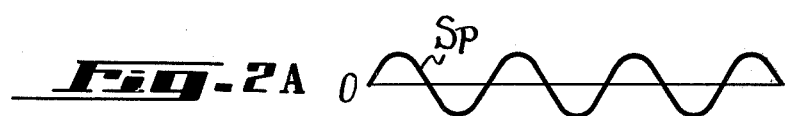
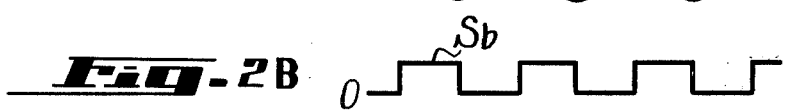
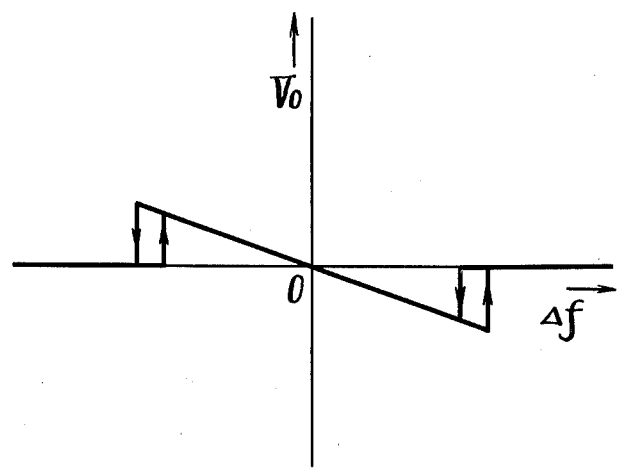

PHASE LOCKED LOOP CIRCUIT

This is a continuation of application Ser. No. 780,243, filed Mar. 22, 1977, now abandoned.

BACKGROUND OF THE INVENTION

1. Field of the Invention

The present invention relates generally to a phase locked loop, and is directed more particularly to a phase locked loop having an indicating means and a means for selectively adjusting the frequency of a signal derived from a variable frequency oscillator.

2. Description of the Prior Art

A phase locked loop is employed in various electronic instruments, for example, in a stereo demodulator of an FM receiver. When incorporated with an FM stereo demodulator, the phase locked loop is used in conjunction with a circuit for supplying a stereo composite signal to a demultiplexing switching circuit, and comprises a circuit for deriving a pilot signal from the stereo composite signal, a variable frequency oscillator, a phase comparator circuit for comparing the phase of an output signal from the oscillator (or, if preferred, for comparing the phase of a signal which is frequency-divided from the output signal of the variable frequency oscillator) with that of the pilot signal, and a circuit for supplying an output from the phase comparator circuit to the variable frequency oscillator as a control signal. The signal from the variable frequency oscillator which is controlled in response to the output from the phase comparator circuit (or the signal frequency-divided therefrom) is applied to the demultiplexing switching circuit as a so-called switching signal. The switching circuit then separates the FM stereo signal into left and right channel signals.

With the above prior art stereo demodulating circuit, the relationship between the deviation of the phase or frequency of the switching signal fed to the switching circuit and the separation of the stereo composite signal is such that if the phase or frequency of the switching signal varies, for instance, when the stereo composite signal is weak, the separation of left and right channels rapidly deteriorates. In theory, when the loop gain of the phase locked loop is infinite, even if the free-running frequency of the variable frequency oscillator is deviated from its normal frequency, for example, 76 KH$_z$ which is four times of the frequency of the 19 KHz pilot signal, the oscillation frequency of the variable frequency oscillator is locked at 76 KH$_z$ and is also synchronized with the pilot signal, and there is no deviation in the phase and frequency of the switching signal.

In practice, however, since the loop gain of the phase locked loop can not be made infinite, whenever the free-running frequency of the variable frequency oscillator deviates from 76 KH$_z$, the oscillation frequency led to the switching circuit also deviates. In other words, the deviation of a filtered DC voltage caused by the deviation of the oscillation frequency is balanced with that of the free-running frequency of the oscillator and the circuit stabilizes so that the oscillation frequency of the variable frequency oscillator deviates. When the oscillation frequency of the oscillator deviates, so does the frequency of the signal applied to the switching circuit. As a result, the separation of stereophonic signals into the left and right channel signals by the switching circuit is deteriorated.

To avoid this defect, during manufacture of an FM stereo receiver, the free-running frequency of the oscillator is adjusted at a normal frequency of 76 KH$_z$ to obtain an optimum separation of signals. However, the free-running frequency of this oscillator suffers long-term changes as the receiver ages and short-term, cyclical changes, for instance, as the level of the power supply varies. Further, since the distortion factor and non-linear crosstalk suppression similarly depend upon the phase and frequency of the signal fed to the switching circuit, they are also degraded.

OBJECTS AND SUMMARY OF THE INVENTION

An object of the invention is to provide a novel phase locked loop which avoids the defects of prior art phase lock loop circuits.

Another object of the invention is to provide a phase locked loop which indicates the phase difference between a reference signal and a signal to be compared by means of simple circuitry and provide means to remove the phase difference.

A further object of the invention is to provide a phase locked loop suitable for use in an FM stereo receiver.

A yet further object of the invention is to provide a phase locked loop with an adjusting means for correcting the oscillation frequency of a variable oscillator so that it equals that of a reference signal despite long term linear variations and short-term cyclical variations in the free-running frequency of the variable frequency oscillator.

According to an aspect of the present invention there is provided a phase locked loop which comprises a variable frequency oscillator, a phase comparator for comparing the phase of an output signal generated by said variable frequency oscillator with the phase of a reference signal and for providing a control signal in response to the phase difference therebetween, a circuit for supplying said control signal to said variable frequency oscillator, an indicator for indicating the phase difference between the output signal of said variable frequency oscillator and the reference signal, and an adjusting circuit for correcting the frequency of the output signal of said variable frequency oscillator.

The other objects, features and advantages of the present invention will become apparent from the following description taken in conjunction with the accompanying drawings.

BRIEF DESCRIPTION OF THE DRAWINGS

FIGS. 2A to 2E are signal waveform diagrams used for explaining the phase locked loop of the invention;

FIG. 3 is a graph shwoing the output from a filter used in FIG. 1 which is based on the frequency and phase differences of a reference signal and a signal to be compared with the former.

DESCRIPTION OF THE PREFERRED EMBODIMENT

An example of the phase locked loop according to the present invention used as the stereo demodulator or demultiplexer of an FM receiver will be described with reference to FIG. 1.

Figure 1:
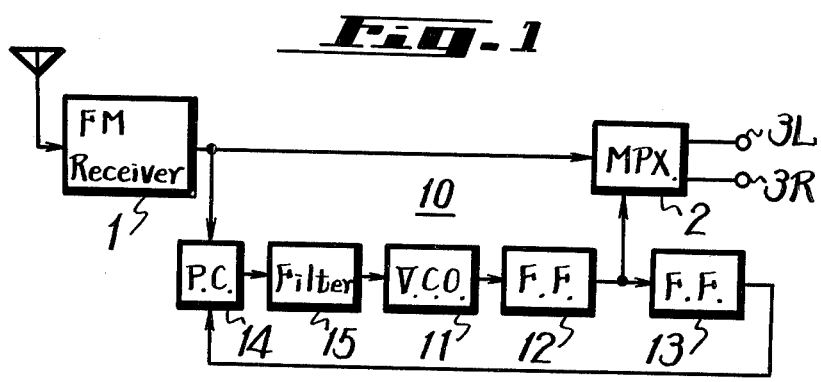
FIG. 1 is a block diagram showing an FM stereo receiver in which an example of the phase locked loop according to the present invention is used.

In FIG. 1, reference numeral designates the elements of an FM receiver from its antenna tuning circuit to its FM demodulator circuit. Upon the stereo reception, a stereo composite signal is derived from the receiver 1 and then fed to a switching circuit 2 for stereo demodulation or demultiplexing in the latter.

A phase locked loop 10 (which will be hereinafter referred simply to as a PLL) produces a switching signal for the switching circuit 2. A voltage controlled variable frequency oscillator circuit 11 (which will be hereinafter referred simply to as a VCO) produces an oscillation signal whose free-running frequency is, for example, four time the frequency of a reference signal. In the illustrated example where the reference signal is a pilot signal included in a stereo composite signal and having the usual frequency of 19 KHz, the free-running frequency of VCO 11 will be 76 KHz. The oscillation signal from the VCO 11 is supplied to a flip-flop circuit 12 which divides the input oscillation signal into a rectangular wave signal with the frequency of 38 KH$_z$. The rectangular wave signal from the flip-flop circuit 12 is supplied to another flip-flop circuit 13 which divides the input signal into a rectangular wave signal with the frequency of the reference or pilot signal, that is, 19 KH$_z$. The rectangular signal from the flip-flop circuit 13 is supplied to a phase comparator circuit 14 which is supplied also with the stereo composite signal from the FM receiver 1. Thus, phase comparator 14 compares the phase of the rectangular signal from the flip-flop 13 with the phase of the pilot signal in the stereo composite signal from the FM receiver 1. The compared output from comparator 14 is supplied to a loop filter 15 for integration. The loop filter 15 produces a DC voltage whose polarity and level correspond to the phase difference between the rectangular wave signal and the pilot signal. This DC voltage is applied to the VCO 11 as its control signal.

Thus, the oscillation signal from the VCO 11 is synchronized with the pilot signal in phase, and hence the rectangular wave signal from the flip-flop 12 is in synchronism with the pilot signal. The rectangular wave signal from the flip-flop 12 is fed to the switching circuit 2 as its control signal. Thus, the switching circuit 2 is changed-over to effect stereo demodulation or demultiplexing, that is, to provide stereophonic left and right channel signals at output terminals 3L and 3R, respectively.

PLL 10 operates to adjust the phase of the output signal of VCO 11 in accordance with the phase relation between the pilot signal $S_p$ and the rectangular wave signal $S_b$ from the flip-flop 13. If the oscillation frequency of the VCO 11 is four times that of the pilot signal $S_p$, the frequency of the rectangular wave signal $S_b$ from the flip-flop 13 is the same as that of the pilot signal $S_p$. Hence, as shown in FIGS. 2A and 2B, the rectangular wave signal $S_b$ is ahead of the pilot signal $S_p$ in phase by 90° and is stable at that state. Under the foregoing circumstances, the phase comparator 14 produces, as its compared output, a signal of positive ¼ cycle and a signal of negative ¼ cycle alternately as shown in FIG. 2D. When the output of the phase comparator 14 is integrated by the filter 15, the integrated output is zero, with no DC component.

If, however, the phase of the signal $S_b$ advances so as to lead that of the pilot signal $S_p$ by more than 90°, the compared output of the phase comparator 14 has a greater positive portion than its corresponding negative portion, as shown in FIG. 2C. Thus, the integrated output of the filter 15 becomes positive. On the other hand, if the phase of the signal $S_b$ delays behind that of the pilot signal $S_p$ more than 90°, the compared output of the comparator 14 has a greater negative portion then its corresponding positive portion, as shown in FIG. 2E. Thus, the integrated output of the filter 15 becomes negative.

Accordingly, the filter 15 produces a DC voltage $V_o$ whose polarity and level are varied in accordance with an N-shaped curve in response to a deviation Δf of the phase or frequency between the pilot signal $S_p$ and signal $S_b$ as shown in FIG. 3. The hysteresis width of the N-shaped characteristic of the output of filter 15 is determined by the loop gain of the PLL 10.

The present invention provides a precisely phased switching signal for a reference signal despite the hysteresis in the loop of PLL 10.

An example of the invention will be described with reference to FIG. 4 in which elements corresponding to those described above with reference to FIG. 1 are identified by the same reference numerals.

Figure 4:
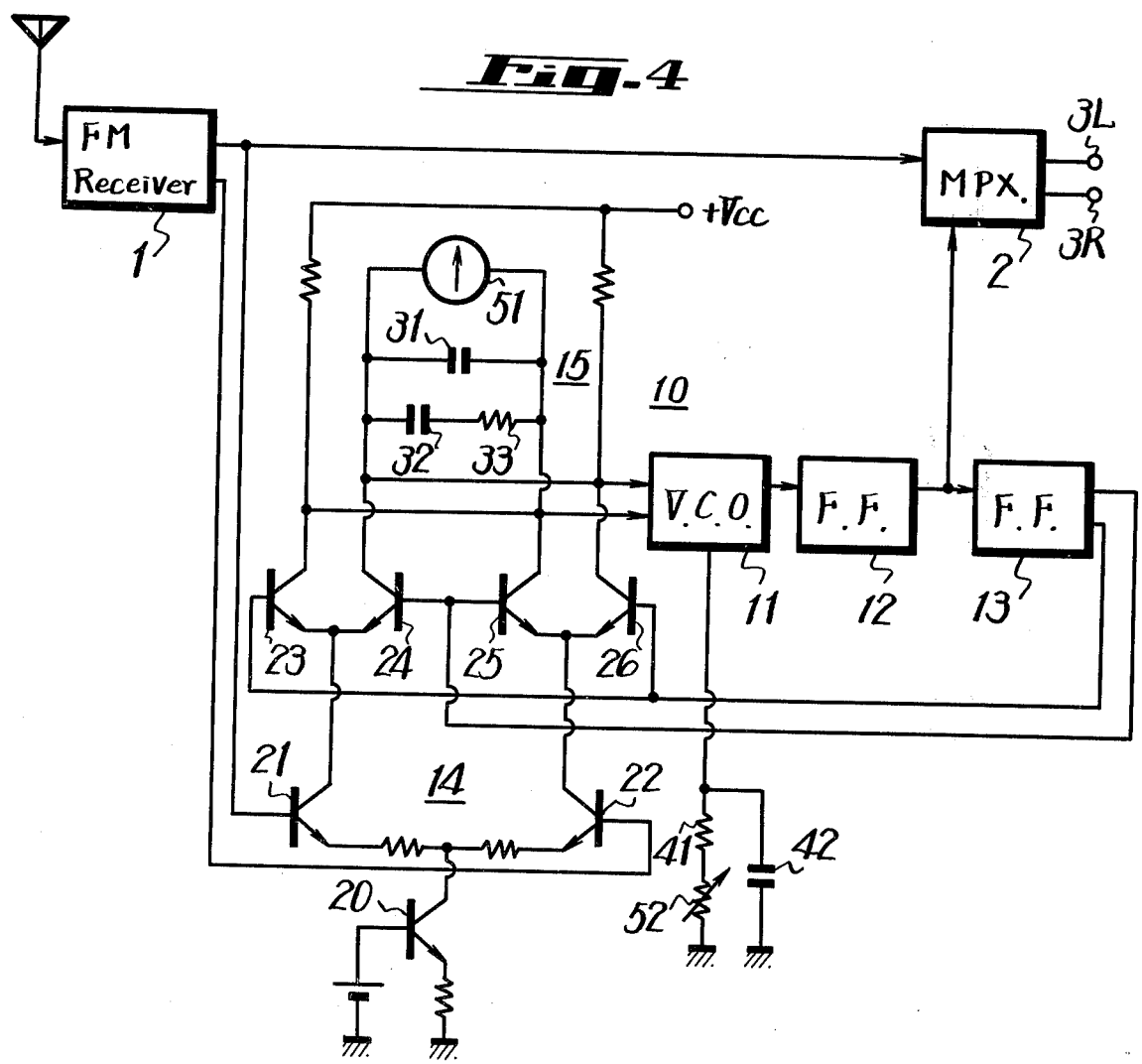
FIG. 4 is a block diagram showing a practical example of a phase comparator and a filter used for forming the phase locked loop of the invention.

In the example of FIG. 4, the phase comparator circuit 14 is formed of a switching circuit of a double-balance type. That is, with a transistor 20 as a constant current source, a first pair of transistors 21 and 22 are connected differentially; with the transistor 21 as a constant current source, a second pair of transistors 23 and 24 are connected differentially; and with the transistor 22 as a constant current source, a third pair of transistors 25 and 26 are connected differentially. In this case, the stereo composite signal is supplied from the FM receiver circuit 1 to the bases of the transistors 21 and 22, and the rectangular wave signal $S_b$ from the flip-flop circuit 13 is supplied to the bases of the transistors 24 and 25 and to the bases of the transistors 23 and 26, respectively. The phase-compared outputs described in connection with FIGS. 2C to 2E are derived between the collectors of the transistors 23, 25 and between the collectors of the transistors 24, 26, respectively. The filter 15, which is formed of a capacitor 31 and a series circuit of a capacitor 32 and a resistor 33 connected in parallel to the capacitor 31, is connected between the collectors of the transistors 24 and 25. The DC voltage $V_o$, which has been described in connection with FIG. 3, is derived from the filter 15 and then supplied to the VCO 11.

With the present invention, a meter 51 is connected between the output terminals of the filter 15 or in parallel to the capacitor 31, and the VCO 11 is provided with a circuit for adjusting its free-running frequency, which circuit consists of two parallel legs connecting VCO 11 to a reference potential. In the case illustrated, one of the parallel legs is formed by a resistor 41 in series with a variable resistor 52, while the other of the parallel legs is constituted by a capacitor 42.

According to the circuit construction described above, whenever the free-running frequency of the VCO 11 varies so that its oscillation frequency changes, the polarity and level of the DC voltage $V_o$ is varied in response to the frequency deviation as shown on FIG. 3. When the varied DC voltage $V_O$ is supplied to meter 51, the needle of the latter deviates from its central or null position and thereby indicates the direction and magnitude of the deviation of the oscillation frequency, that is of the switching frequency fed to switching circuit 2. Thus, if the variable resistor 52 is adjusted to make the indication on the meter 51 zero, deviation of the free-running frequency and oscillation frequency of the VCO 11 from that of the reference signal can be removed and, therefore, there appears no deviation in the switching frequency. As a result, the separation, distortion factor, non-linear crosstalk, and other characteristics of the stereophonic signals obtained at the terminals 3L and 3R are optimized.

As described above, according to the present invention, even if there occurs slow, long-term variation, or cyclical, short-term variation in the free-running frequency of VCO 11, or deviation of the frequency of the pilot signal, the PLL 10 can provide an accurate in-phase signal to multiplexing switching circuit 2 and hence the stereo demultiplexing can be carried out to provide optimum stereo separation. To this end, the provision alone of the meter 51 and the variable resistor 52 in combination with the prior art PLL circuit is sufficient, so that the PLL of the present invention is very simple in circuit construction and hence inexpensive.

Although the above description relates to the use of a PLL according to the present invention for stereophonic demodulation, it will be easily understood that the present invention can be adapted to a PLL in a servo-type record player in which the rotation of a turn table is locked-in on a signal from, for example, a quartz oscillator; or to a PLL in a demodulation circuit for a 4-channel stereo record player of a so-called carrier system.

Further, it is possible to supply the DC voltage $V_o$ from the filter 15 to the meter 51 through an amplifier, or to use an indicating element such as a luminous diode in place of the meter 51.

It will be apparent that many modifications and variations could be effected by one skilled in the art without departing from the spirits or scope of the novel concepts of the invention.

I claim as my invention:

1. A phase-locked loop circuit comprising a voltage controlled oscillator providing an output signal and having a free-running frequency that may vary with time; a phase comparator comparing the phase of a reference signal with the phase of a compared signal which is derived from said output signal of the voltage controlled oscillator for providing a D.C. control voltage in dependence on a variation of the phase relation of said compared signal with said reference signal, said phase comparator including a first pair of transistors each having an input electrode supplied with said reference signal and an output electrode, a second pair of transistors connected to said output electrode of one of said first pair of transistors, and a third pair of transistors connected to said output electrode of the other of said first pair of transistors, said second and third pairs of transistors each having an input electrode supplied with said compared signal; a filter circuit connected to said phase comparator between output electrodes of said second and third pairs of transistors and to said voltage controlled oscillator and through which said control voltage is applied to said voltage controlled oscillator so as to shift the actual frequency of said output signal from the oscillator in respect to said free-running frequency for eliminating said variation of the phase relation; indicator means including a meter whose center is null and which is connected in parallel with said filter circuit for indicating the value and polarity of said D.C. control voltage, and manually actuable means connected with said voltage controlled oscillator for adjusting said free-running frequency of the voltage controlled oscillator in the sense, and to the extent indicated by said meter for eliminating said control voltage due to a variation of said free-running frequency with time.

* * * * *